United States Patent
Jimenez Pino et al.

(10) Patent No.: US 11,440,423 B2
(45) Date of Patent: Sep. 13, 2022

(54) SYSTEM AND METHOD FOR ON-BOARD CHARGER WITH A PULSATING BUFFER

(71) Applicant: Lear Corporation, Southfield, MI (US)

(72) Inventors: Rafael Jimenez Pino, Valls (ES); Pablo Gaona Rosanes, Valls (ES); Hector Sarnago Andia, Ölvega (ES); Oscar Lucia Gil, Saragossa (ES)

(73) Assignee: LEAR CORPORATION, Southfield, MI (US)

( * ) Notice: Subject to any disclaimer, the term of this patent is extended or adjusted under 35 U.S.C. 154(b) by 225 days.

(21) Appl. No.: 16/945,127

(22) Filed: Jul. 31, 2020

(65) Prior Publication Data

US 2022/0032797 A1    Feb. 3, 2022

(51) Int. Cl.
| | |
|---|---|
| *B60L 53/22* | (2019.01) |
| *H02J 1/02* | (2006.01) |
| *H03K 17/955* | (2006.01) |
| *H03K 17/95* | (2006.01) |
| *H02J 7/00* | (2006.01) |

(52) U.S. Cl.
CPC ............ *B60L 53/22* (2019.02); *H02J 1/02* (2013.01); *H03K 17/952* (2013.01); *H03K 17/955* (2013.01); *H02J 7/00711* (2020.01)

(58) Field of Classification Search
None
See application file for complete search history.

(56) References Cited

U.S. PATENT DOCUMENTS

| | | |
|---|---|---|
| 2017/0085177 A1 | 3/2017 | Jimenez Pino et al. |
| 2017/0229972 A1 | 8/2017 | Cerqueira Pinto Bezerra Varaj O et al. |
| 2019/0160961 A1* | 5/2019 | Shen .................. H02J 7/0013 |
| 2019/0165713 A1* | 5/2019 | Namuduri ............... H02M 1/08 |
| 2019/0288607 A1 | 9/2019 | Zong et al. |
| 2020/0321867 A1* | 10/2020 | Radecker ............. H02M 3/156 |

FOREIGN PATENT DOCUMENTS

CN    103475232 A    12/2013

OTHER PUBLICATIONS

U.S. Appl. No. 16/682,398, filed Nov. 13, 2019.

* cited by examiner

*Primary Examiner* — Pinping Sun
*Assistant Examiner* — Joel Barnett
(74) *Attorney, Agent, or Firm* — Brooks Kushman P.C.

(57) ABSTRACT

In at least one embodiment, an apparatus including a pulse buffer (PB) converter. The PB converter including a housing, a printed circuit board (PCB), at least one inductor, and at least one capacitor is provided. The PCB is positioned in the housing and includes at least one first power switch and at least one second power switch positioned thereon. The at least one inductor is positioned in the housing and off board from the PCB to interface with the at least one first power switch and the at least second power switch. The at least one capacitor is positioned in the housing and off board from the PCB to interface with the at least one first power switch and the at least one second power switch to regulate an energy output to one or more vehicle batteries during a charging operation.

20 Claims, 9 Drawing Sheets

SYSTEM AND METHOD FOR ON-BOARD CHARGER WITH A PULSATING BUFFER

TECHNICAL FIELD

Aspects disclosed herein may generally relate to a system and method for providing an on-board charger with a pulsating buffer. In one example, the disclosed on-board charger and pulsating buffer may be used in connection with vehicle on-board charging. These aspects and others will be discussed in more detail below.

BACKGROUND

An on-board charger (OBC) of an electric vehicle is used for charging a traction battery of the vehicle. The OBC converts electrical power absorbed from an AC power source into DC electrical power and charges the battery with the DC electrical power.

SUMMARY

In at least one embodiment, an apparatus including a pulse buffer (PB) converter is provided. The PB converter to provide an energy output to one or more vehicle batteries. The PB converter including a housing, a printed circuit board (PCB), at least one inductor, and at least one capacitor. The at least one inductor is positioned in the housing and off board from the PCB to interface with the at least one first power switch and the at least second power switch. The at least one capacitor is positioned in the housing and off board from the PCB to interface with the at least one first power switch and the at least one second power switch to regulate an energy output to the one or more vehicle batteries during a charging operation.

In at least another embodiment, an apparatus including pulsating buffer (PB) converter is provided. The PB converter includes a housing, a printed circuit board (PCB), at least one inductor, and at least one capacitor is provided. The PCB is positioned in the housing and includes at least one first power switch and at least one second power switch positioned thereon. The at least one inductor is positioned in the housing and off board from the PCB to interface with the at least one first power switch and the at least second power switch. The at least one capacitor is positioned in the housing and off board from the PCB to interface with the at least one first power switch and the at least one second power switch to regulate an energy output to one or more vehicle batteries during a charging operation.

In at least one embodiment, an apparatus including a printed circuit board (PCB), at least one inductor, and at least one capacitor is provided. The printed circuit board (PCB) is positioned in a housing and includes at least one first power switch and at least one second power switch positioned thereon. The at least one inductor is positioned in the housing and off board from the PCB to interface with the at least one first power switch and the at least second power switch. The at least one capacitor positioned in the housing and off board from the PCB to interface with the at least one inductor, the at least one first power switch, and the at least one second power switch to provide an energy output to store a first voltage or a second voltage on one or more vehicle batteries during a charging operation.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It is recognized that the controllers as disclosed herein may include various microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, such controllers as disclosed utilizes one or more microprocessors to execute a computer-program that is embodied in a non-transitory computer readable medium that is programmed to perform any number of the functions as disclosed. Further, the controller(s) as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware-based inputs and outputs for receiving and transmitting data, respectively from and to other hardware-based devices as discussed herein. One example of an on-board FIG. 1 generally illustrates a block diagram of an electrical system 10 having an on-board charger (OBC) 12. One example of an OBC is set forth in in pending U.S. application Ser. No. 16/682,398 ("the '398 application") entitled "ON-BOARD CHARGER (OBC) SINGLE-STAGE CONVERTER" as filed on Nov. 13, 2019 the disclosure of which is hereby incorporated by reference in its entirety. The OBC 12 is generally positioned "on-board" an electric vehicle 13. The term "electric vehicle" herein may encompass any type of vehicle which uses electrical power for vehicle propulsion and encompasses battery-only electric vehicles (BEV), hybrid electric vehicles (HEV), plug-in hybrid electric vehicles (PHEV), and the like. The OBC 12 may be used for charging a traction battery 14 of the electric vehicle 13. The traction battery 14 may be a high voltage (HV) direct current (DC) traction battery as dictated per electrical energy requirements for electric vehicle propulsion.

Figure 1:
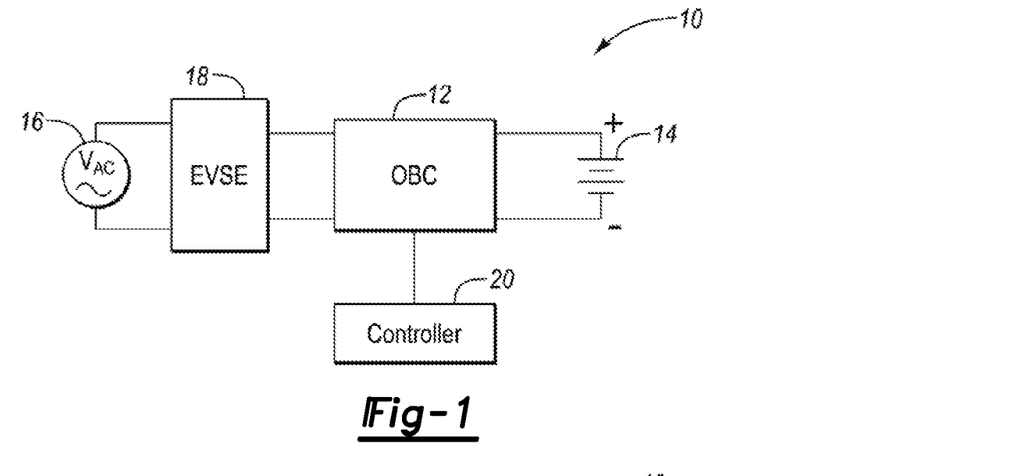
FIG. 1 depicts a block diagram of an electrical system having an on-board charger (OBC)

The electrical system 10 further includes an alternating (AC) power source such as a mains supply 16 of an electrical grid. The OBC 12 charges the traction battery 14 using electrical power from the mains supply 16. The OBC 12 includes an input that connects to the mains supply 16, via an external Electric Vehicle Supply Equipment (EVSE) 18, to absorb electrical power from the mains supply 16. The OBC 12 includes an output that connects to the traction battery 14. The OBC 12 converts electrical power absorbed from the mains supply 16 into DC electrical power and charges the traction battery 14 with the DC electrical power.

A controller 20 is operably coupled to the OBC 12. The controller 20 may be an electronic device such as at least one processor, at least one micro-controller, or the like (e.g., a computer) that is positioned on-board the electric vehicle 13. The controller 20 may be defined as a vehicle controller. The controller 20 is operably coupled to the OBC 12 to control operations of the OBC 12. The controller 20 controls the OBC 12 to convert electrical power from the mains supply 16 into DC electrical power and charging traction battery 14 with the DC electrical power. For example, the controller 20 selectively controls switching and switching duration of power switches (not shown) positioned in the OBC 12. The power switches may be used to convert electrical power received from the mains supply 16 into a predetermined amount of DC electrical power. The controller 20 may communicate and control other nodes of the electrical system 10 and the electric vehicle 13 including nodes involved in the charging applications.

Various OBCs may include a dual stage architecture including a power factor corrector (PFC) and a DC/DC converter (not shown). The PFC and the DC/DC converter may be electrically coupled via a capacitive energy buffer (or a "DC link capacitor") (also not shown). The PFC may be connectable to the mains supply 16 and the DC/DC converter is connected to the traction battery 14. The PFC performs the AC/DC conversion and is controlled by the controller 20 to ensure a high-power factor at the input. The controller 20 controls the DC/DC converter to convert a high-voltage stabilized input at the DC link capacitor into a DC battery level for the traction battery 14. In this regard, the DC/DC converter adapts the output voltage/current to the requirements of the traction battery 14. In sum, the PFC functions as the grid front end and the DC/DC converter adapts the output to the range of the traction battery 14.

The PFC generally includes one or more inductors that may be bulky and costly. The energy conversion scheme of ordinary OBCs inherently requires an energy storage element to store/provide the difference between the instantaneous input power, which is sinusoidal to comply with electromagnetic compatibility (EMC) standards, and the output power, which is expected to be constant. Presently, due to high-power requirements, the energy storage element utilized may be involve a configuration of electrolytic capacitors (e.g., the DC-link capacitor). The high capacity that may be required may generally lead to bulky capacitors (i.e., the DC link capacitor) which reduces power density (for example, around 30% volume) and has significant implications on the maximum operating temperature and estimated lifetime (e.g., mean time between failures (MTBF)).

Additionally, a PFC and a DC/DC converter may be present for each rail of the OBC 12. Thus, a 3-phase, ordinary OBC may include three sets of PFCs and DC/DC converters. As described above, each set includes several energy storage elements. Namely, each rail includes one or more inductors at the PFC stage and electrolytic capacitors at the DC/DC converter stage. This aspect may lead to relatively poor power density and relatively poor MTBF and increased cost.

Figure 2:
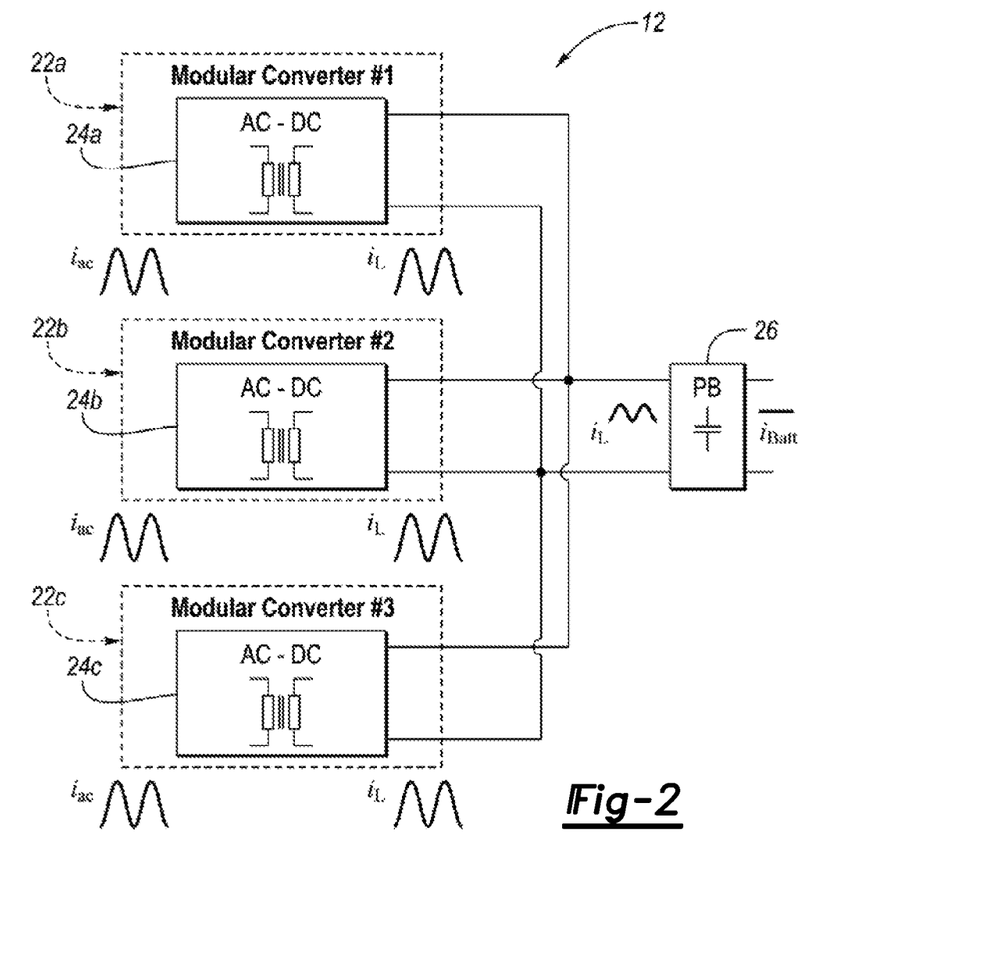
FIG. 2 depicts a block diagram of the OBC in which the OBC is a three-phase OBC.

Referring now to FIG. 2, with continual reference to FIG. 1, a block diagram of the OBC 12 is shown. The OBC 12 may be an n-phase OBC, where n is an integer of at least one. In the embodiment illustrated in FIG. 2, the OBC 12 may be a 3-phase OBC having first, second, and third rails 22a, 22b, and 22c.

The rails 22a, 22b, 22c may each include the same type of electrical circuitry in the form of a "modular converter" including an AC/DC converters 24a, 24b, 24c, respectively. Each AC/DC converter 24a, 24b, 24c is a single stage topology. Thus, unlike ordinary OBCs having a dual stage architecture including a PFC, a DC link capacitor, and a DC/DC converter for each rail, the OBC 12 may include a single stage architecture including an AC/DC converter for each rail 22a, 22b, 22c.

The OBC 12 further includes a pulsating buffer (PB) converter 26. The PB converter 26 is shared by AC/DC converters 24a, 24b, 24c. Particularly, the AC/DC converters 24a, 24b, 24c may be individually cascade-connected to the PB converter 26 as illustrated in FIG. 2. The AC/DC converters 24a, 24b, 24c are connectable at their respective input ends to the mains supply 16 and are connected at their respective output ends to the input end of PB converter 26. The output end of the PB converter 26 is connected to the traction battery 14. The AC/DC converters 24a, 24b, 24c together with the PB converter 26 function to convert electrical power from mains supply 16 into DC electrical power for charging traction battery 14. More particularly, the controller 20 controls the operation of the AC/DC converters 24a, 24b, 24c and the operation of the PB converter 26 according to control strategies for the OBC 12 to convert electrical power from the mains supply 16 into DC electrical power for charging the traction battery 14.

The AC/DC converters 24a, 24b, 24c include the same type of electrical circuitry and function the same. Thus, only the AC/DC converter 24a will be described in greater detail. In general, the AC/DC converter 24a includes a converter topology which neglects the use of a classical PFC and its associated inductor. The AC/DC converter 24a may be combined with the pulsating buffer (PB) converter 26 to maximize the use of an energy storage capacitor (e.g., the energy storage capacitor is in parallel with the converter 26) with the traction battery 14. This aspect may significantly reduce the capacitor size requirements.

In operation, the AC/DC converter 24a directly converts input AC from the mains supply 16 into a DC voltage and a positive oscillating current (i.e., "current ripple"). The input AC from the mains supply 16 is sinusoidal as understood. The output of AC/DC converter 24a is a DC voltage and a current ripple. The PB converter 26 post-processes the DC voltage and current ripple output of the AC/DC converter 24a to preferably eliminate or substantially eliminate (or minimize or at least reduce) the current ripple and transform the output of the AC/DC converter 24a into a battery level DC output.

Figure 3:
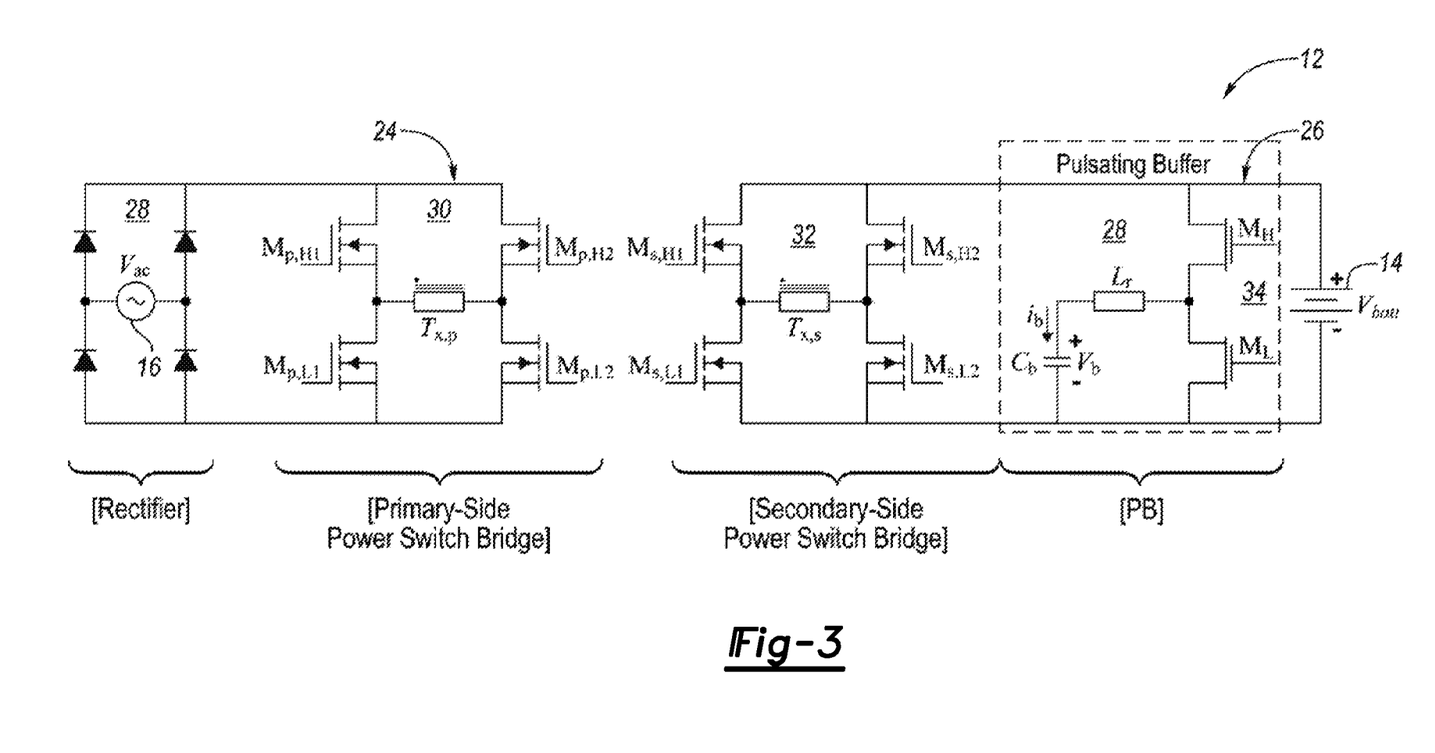
FIG. 3 depicts an electrical schematic diagram of the OBC in which the OBC is a single-phase OBC in accordance with an embodiment.

Referring now to FIG. 3, with continual reference to FIGS. 1 and 2, an electrical schematic diagram of the OBC 12 in which the OBC 12 is a single-phase OBC is shown. The depiction of the OBC 12 in FIG. 3 represents a single-phase direct OBC implementation (unidirectional). As shown in FIG. 3, the OBC 12 includes an AC/DC converter 24 and pulsating buffer (PB) converter 26. The AC/DC converter 24 is connected to the mains supply 16. The PB converter 26 is connected to the traction battery 14.

As further shown in FIG. 3, the AC/DC converter 24 includes a group of four diodes which form a full-diode bridge rectifier 28 at the front end of the AC/DC converter 24. The rectifier 28 is connected to the mains supply 16 to rectify the AC input for the AC/DC converter 24. The AC/DC converter 24 further includes a first group of four power switches which form a primary-side power switch bridge 30 on a primary-side of a transformer Tx. The AC/DC converter 24 further includes a second group of four power switches which form a secondary-side power switch bridge 32 on a secondary-side of the transformer Tx. In a refinement, the multiple secondary-side power switch bridges 32 may be provided on the secondary-side of the transformer Tx (each preferably with a separate secondary coil of Tx).

The AC/DC converter 24 with primary-side and secondary-side power switch bridges 30, 32 on respective sides of the transformer Tx includes a structure based on a dual-active bridge (DAB) topology. The controller 20 controls the power switch bridges 30, 32 to convert the rectified voltage that is inputted from the rectifier 28 into the DC voltage and current ripple output. The DC voltage and current ripple output is outputted from the AC/DC converter 24 to the PB converter 26.

As further shown in FIG. 3, the PB converter 26 includes a pair of power switches 34, an inductor Lr, and an energy storage capacitor Cb. The PB converter 26 thus has a current ripple processing based on pulsating buffer topology. The PB converter 26 receives the current ripple outputted from the AC/DC converter 24. The controller 20 controls the pair of power switches 34 to eliminate the current ripple and transform the output of AC/DC converter 24 into a battery level DC output for charging traction battery 14.

As shown in FIG. 3, the power switches of the primary-side and the secondary-side power switch bridges 30, 32 of AC/DC converter 24 and the power switches of the power switch pair 34 of PB converter 26 are MOSFETs.

In the OBC 12, only a single magnetic component, i.e., the transformer Tx, is in the DC/DC block of the AC/DC converter 24. The PB converter 26 replaces the DC link capacitor compensation function of an ordinary OBC. The PB converter 26 compensates the current ripple outputted from the AC/DC converter 24 to the PB converter 26 to provide a smooth DC output voltage to thereby significantly reduce the size of the energy storage capacitor Cb of the PB converter 26.

Figure 4:
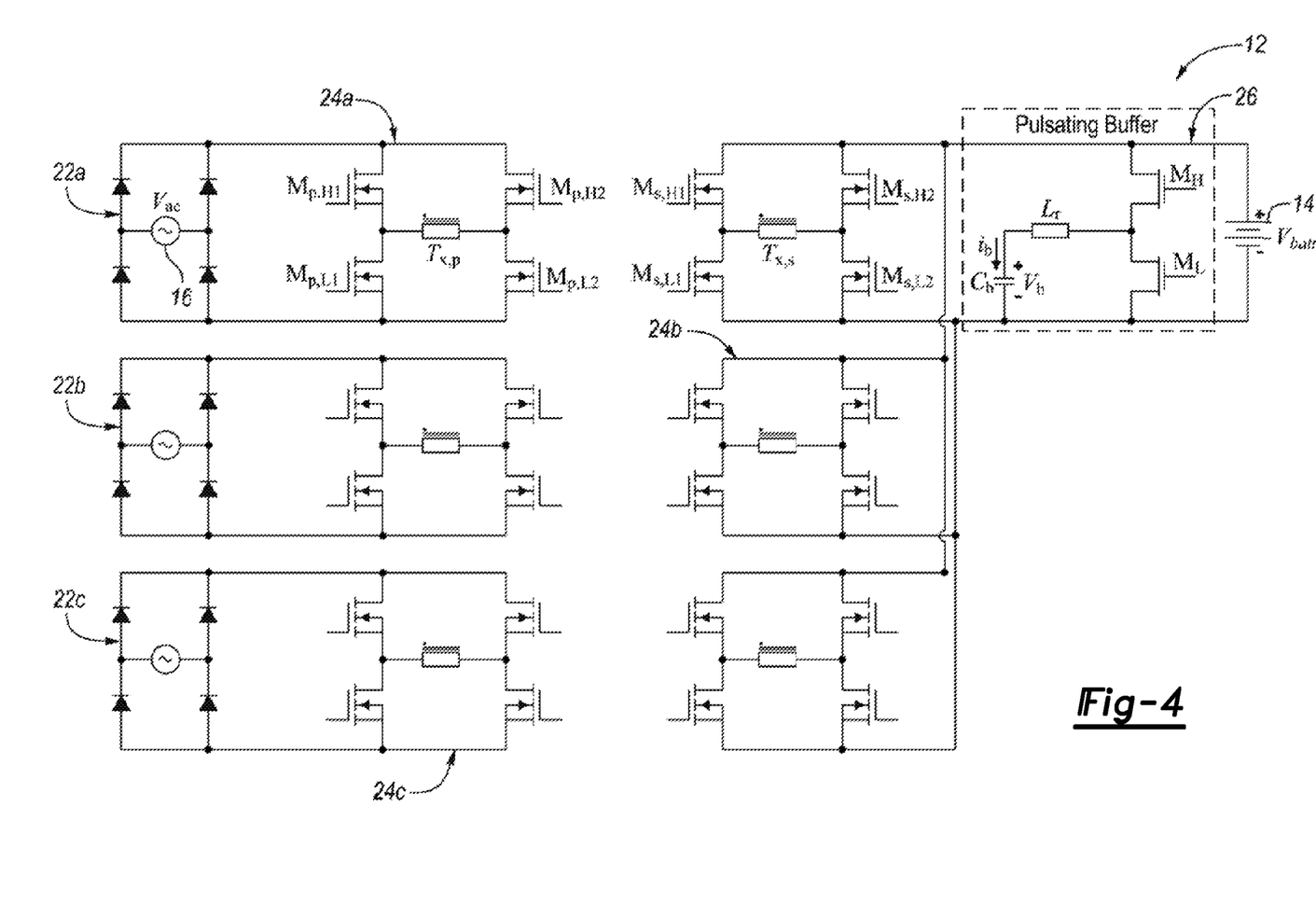
FIG. 4 depicts an electrical schematic diagram of the OBC in which the OBC is a 3-phase OBC in accordance with another embodiment.

Referring now to FIG. 4, with continual reference to FIGS. 1, 2, and 3, an electrical schematic diagram of the OBC 12 in which the OBC 12 is a 3-phase OBC in accordance with an embodiment is shown. The depiction of the OBC 12 in FIG. 4 represents a 3-phase direct OBC implementation (unidirectional). As shown in FIG. 4, the OBC 12 includes three rails 22a, 22b, 22c having AC/DC converters 24a, 24b, 24c, respectively. AC/DC converters 24a, 24b, 24c are connected in parallel to one another between the mains supply 16 and the PB converter 26. In this regard, the input ends of the AC/DC converter 24a, 24b, 24c are connected to the mains supply 16 and the output end of PB converter 26 is connected to the traction battery 14.

Each rail 22a, 22b, 22c absorbs and converts electrical power from the mains supply 16 into DC electrical power for charging traction battery 14. Each rail 22a, 22b, 22c, for example, can deliver 3.6 kW of electrical power for charging the traction battery 14. As such, in this instance, the 3-phase OBC 12 shown in FIG. 4 may deliver 10.8 kW (3*3.6 kW) of electrical power for charging the traction battery 14.

As described and as illustrated, the OBC 12 has a modular implementation which enables both single-phase OBC implementation as shown in FIG. 3 and multi-phase OBC implementation such as 3-phase OBC implementation as shown in FIG. 4. In addition to the previously mentioned benefits of the single-phase OBC implementation, the multi-phase OBC implementation has the benefits of sharing a single PB converter 26 thereby further enabling cost reduction. Further, due to the multi-phase OBC implementation, the ripple at the output of the AC/DC converter 24a, 24b, 24c may be reduced. Due to the reduction in the multi-phase OBC implementation, this condition may enable the use of a smaller inductor Lr and energy storage capacitor Cb components of the PB converter 26 (typically, for the 3-phase OBC implementation, 3:1 size vs. power reduction).

Figure 5:
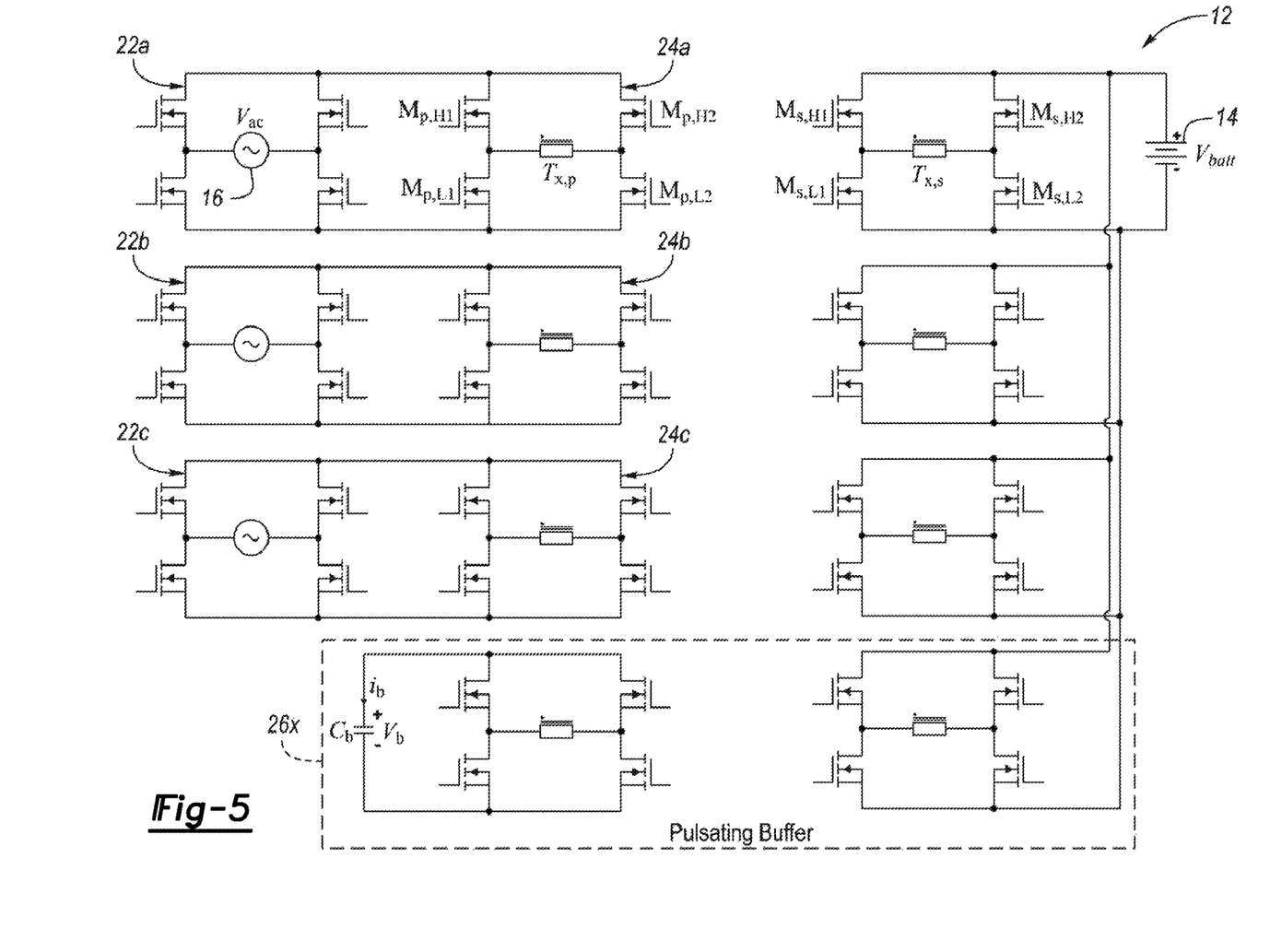
FIG. 5 depicts an electrical schematic diagram of the OBC in which the OBC is a 3-phase OBC in accordance with another embodiment.

As indicated, the OBC 12 shown in each of FIG. 3 and FIG. 4 is unidirectional in that power flow from the mains supply 16 to the AC/DC converter 24 to the PB converter 26 to the traction battery 14. However, the OBC 12 can be bidirectional. For instance, the OBC 12 shown in each of FIG. 3 and FIG. 4 can be made bidirectional by replacing the diodes of rectifier 28 of AC/DC converter 24 with active switches, such as MOSFET switches (as shown in FIG. 5), to thereby make the rectifier be bidirectional. Consequently, the topology of OBC 12 can be implemented using a synchronous rectifier (bidirectional) enabling a bidirectional power flow: grid-to-vehicle (G2V) and vehicle-to-grid (V2G).

Referring now to FIG. 5, with continual reference to FIGS. 1, 2, 3, and 4, an electrical schematic diagram of the OBC 12 in which the OBC 12 is a 3-phase OBC in accordance with another embodiment is shown. The depiction of OBC 12 in FIG. 5 represents a 3-phase, direct OBC implementation (bidirectional). As shown in FIG. 5, the OBC 12 includes three rails 22a, 22b, 22c having AC/DC converters 24a, 24b, 24c, respectively. The OBC 12 further includes a PB converter 26x. The PB converter 26x is connected in cascade with the AC/DC converters 24a, 24b, 24c. The AC/DC converters 24a, 24b, 24c are connected in parallel to one another with their input ends being connected to the mains supply 16 and their output ends together with the PB converter 26x being connected to traction battery 14.

In operation, all three AC/DC converters 24a, 24b, 24c provide energy to the PB converter 26x which compensates the energy (i.e., compensates the energy outputs of the AC/D converters) to provide the DC electrical power (i.e., constant-voltage, constant-current output) for charging traction battery 14.

In addition to the previously mentioned benefits, this 3-phase OBC with cascade PB converter implementation shown in FIG. 5 has the benefits of sharing a single optimized PB converter 26x thereby increasing power density of the complete OBC (e.g., some cost penalty added due to additional semiconductors in PB converter 26x). Further, benefits include maximizing the use of the energy storage capacitor Cb of the PB converter 26x independently of the voltage of traction battery 14 to thereby achieve higher performance. The energy storage capacitor Cb of the PB converter 26x may have a maximum working voltage higher than the required output voltage. Then, with this topology shown in FIG. 5, the energy storage capacitor Cb may work at a higher voltage requiring less current (that is in direct relation with losses in this stage).

Figure 6:
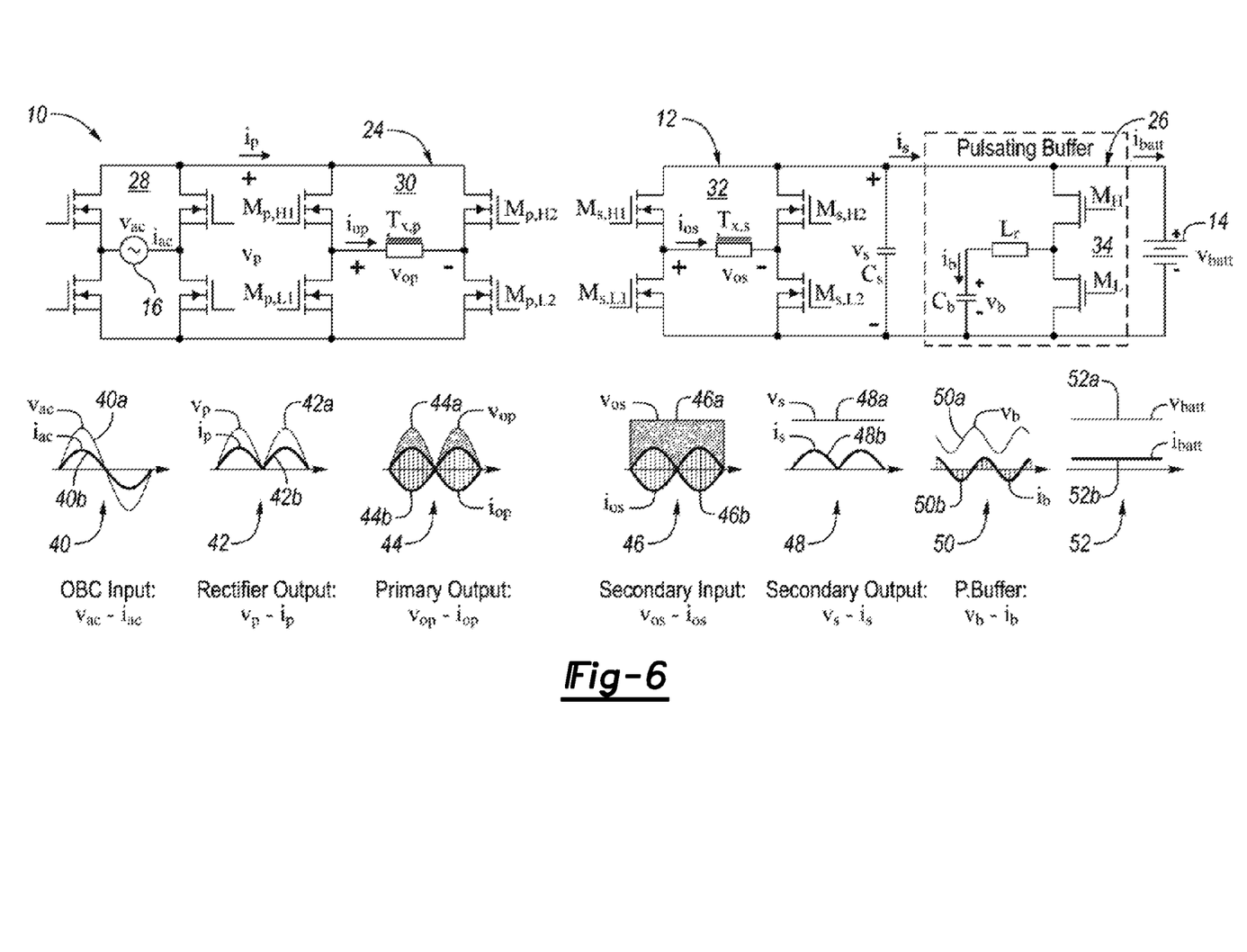
FIG. 6 depicts an electrical schematic diagram of a rail of the OBC with voltage/current waveform diagrams respectively associated with a mains supply of the electrical system, primary-side and secondary-side power switch bridges of an AC/DC converter of the OBC, a pulsating buffer (PB) converter of the OBC, and a traction battery of the electrical system.

Referring now to FIG. 6, with continual reference to FIGS. 1, 2, 3, and 4, an electrical schematic diagram of a rail of OBC 12 with voltage/current waveform diagrams respectively associated with the mains supply 16, the primary-side and secondary-side power switch bridges 30, 32 of the AC/DC converter 24, the PB converter 26, and the traction battery 14 is shown.

In operation, the mains supply 16 inputs a voltage/current to the OBC 12. The voltage/current waveform diagram 40 represents the voltage/current inputted from the mains supply 16 to the OBC 12. The inputted voltage/current includes an inputted voltage (vac) having a sinusoidal voltage waveform 40a and an inputted current (iac) having a corresponding sinusoidal current waveform 40b.

The rectifier 28 of the AC/DC converter 24 receives the inputted voltage/current from the mains supply 16 and rectifies the inputted voltage/current into a rectified voltage/current. Voltage/current waveform diagram 42 represents the rectified voltage/current output from the rectifier 28. The rectified output voltage/current includes a rectified output voltage (vp) having a rectified, sinusoidal voltage waveform 42a and a rectified output current (ip) having a corresponding rectified, sinusoidal current waveform 42b.

The primary-side power switch bridge 30 of AC/DC converter 24 on the DC/DC primary-side of the transformer Tx receives the rectified output voltage/current from the rectifier 28. As will be described in greater detail below, the controller 20 controls the operation of the primary-side power switch bridge 30 to draw a requisite amount of rectified output current associated with the rectified output voltage from rectifier 28 and generate therefrom a primary-side output voltage/current on the primary-side of the transformer Tx. Voltage/current waveform diagram 44 represents the primary-side output voltage/current. The primary-side output voltage/current includes a primary-side output voltage (vop) having a rectified, sinusoidal peak voltage waveform 44a and a primary-side output current (iop) having a mirrored, sinusoidal peak current waveform 44b.

Generally, in conjunction with controlling the operation of the primary-side power switch bridge 30 to generate the primary-side output voltage/current (vop)/(iop), the controller 20 controls the operation of secondary-side power switch bridge 32 of the AC/DC converter 24 to generate, a secondary-side input voltage/current on the secondary-side of the transformer Tx, from the primary-side voltage/current (vop)/(iop). Voltage/current waveform diagram 46 represents the secondary-side input voltage/current. The secondary-side input voltage/current includes a secondary-side input voltage (vos) having a DC peak voltage waveform 46a and a secondary-side input current (ios) having a mirrored, sinusoidal peak current waveform 46b.

In the embodiment of OBC 12 shown in FIG. 6, the OBC 12 further includes a capacitor Cs connected in parallel between the secondary-side power switch bridge 32 and the PB converter 26. The capacitor Cs is charged with the secondary-side input voltage/current (vos)/(ios) to supply therefrom a secondary-side output voltage/current. Voltage/current waveform diagram 48 represents the secondary-side output voltage/current. The secondary-side output voltage/current includes a positive DC source voltage (vs) 48a and a rectified, sinusoidal source current (is) 48b.

The PB converter 26 draws a buffer current associated with a buffer voltage from capacitor Cs. As will be described in greater detail below, the controller 20 controls the operation of pair of the power switches 34 of the PB converter 26 for the PB converter 26 to draw a requisite amount of buffer current associated with the buffer voltage and generate therefrom a targeted, battery voltage/current. The targeted, battery voltage/current is output from the PB converter 26 to charge the traction battery 14.

Voltage/current waveform diagram 50 represents the buffer current (ib) drawn by the PB converter 26 and the associated buffer voltage (vb). The buffer voltage (vb) is a positive DC offset, sinusoidal voltage 50a and the buffer current (ib) has a sinusoidal peak current waveform 50b.

Voltage/current waveform diagram 52 represents the battery voltage/current actually outputted from the PB converter 26 to charge the traction battery 14. The battery voltage/current outputted from the PB converter 26 includes a positive DC voltage (vbatt) 52a and a positive DC current (ibatt) 52b.

Figure 7:
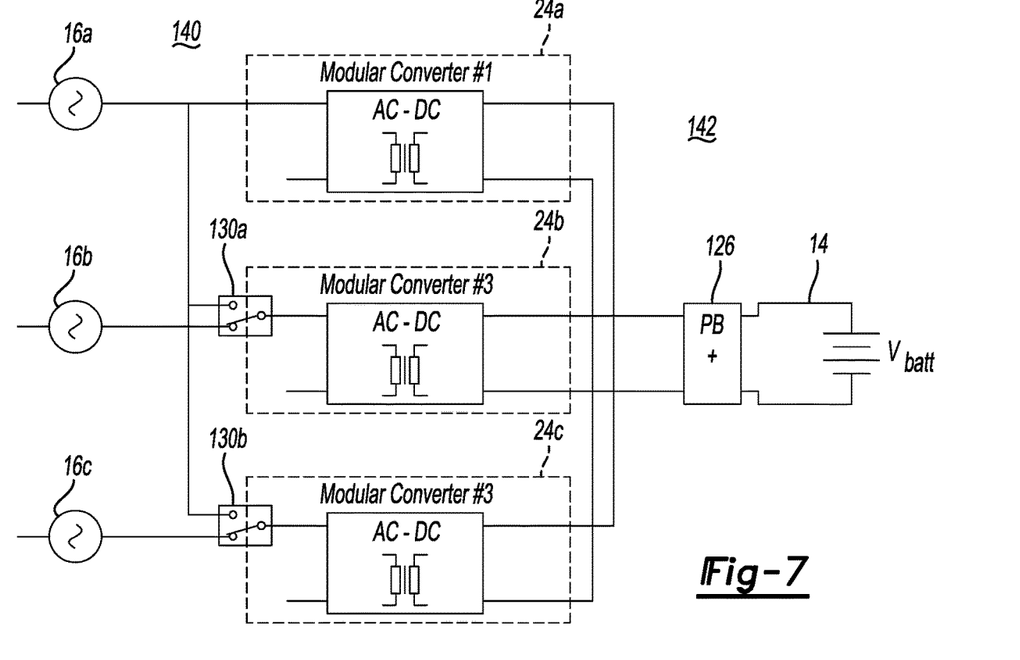
FIG. 7 depicts an example of a plurality of DC/DC converters that support two voltage domains in accordance to one embodiment.

FIG. 7 depicts an example of another electrical system 100 including a plurality of DC/DC converters 24a-24c that support two voltage domains in accordance to one embodiment. The electrical system 100 further includes a plurality of mains supplies 16a, 16b, 16c, an OBC 120, a PB converter 126, and the traction battery 14. Each mains supply 16a, 16b, 16c is operably coupled to a corresponding rail 22a, 22b, 22c, respectively. The OBC 120 may be an n-phase OBC, where n is an integer of at least one. In the embodiment illustrated in FIG. 2, the OBC 12 may be a 3-phase OBC having first, second, and third rails 22a, 22b, and 22c. Each mains supply 16a, 16b, 16c is operably coupled to a corresponding rail 22a, 22b, 22c, respectively.

The rails 22a, 22b, 22c may each include the same type of electrical circuitry in the form of a "modular converter" including an AC/DC converters 24a, 24b, 24c, respectively. Each AC/DC converter 24a, 24b, 24c is a single stage topology. As similarly discussed in connection with FIG. 2, thus, unlike ordinary OBCs having a dual stage architecture including a PFC, a DC link capacitor, and a DC/DC converter for each rail, the OBC 12 may include a single stage architecture including an AC/DC converter for each rail 22a, 22b, 22c.

The PB converter 126 may be shared by AC/DC converters 24a, 24b, 24c. Particularly, the AC/DC converters 24a, 24b, 24c may be individually cascade-connected to the PB converter 26 as illustrated in FIG. 7. The AC/DC converters 24a, 24b, 24c may be connectable at their respective input ends to a corresponding mains supply 16a, 16b, 16c and are connected at their respective output ends to the input end of PB converter 26.

The output end of the PB converter 126 is connected to the traction battery 14. As noted above, the AC/DC converters 24a, 24b, 24c together with the PB converter 126 function to convert electrical power from mains supplies 16a, 16b, 16c into DC electrical power for charging the traction battery 14. More particularly, a controller 120 controls the operation of the AC/DC converters 24a, 24b, 24c and the operation of the PB converter 126 according to control strategies for the OBC 120 to convert electrical power from the mains supplies 16a, 16b, 16c into DC electrical power for charging the traction battery 14.

The AC/DC converters 24a, 24b, 24c include the same type of electrical circuitry and function the same. As noted above, each AC/DC converter 24a, 24b, 24c includes a converter topology which neglects the use of a classical PFC and its associated inductor. The AC/DC converter 24a may be combined with the PB converter 126 to maximize the use of an energy storage capacitor, in parallel with the traction battery 14. This aspect may significantly reduce the rail capacitor size requirements.

In operation, the AC/DC converter 24a directly converts input AC from the mains supply 16a into a DC voltage and a positive oscillating current (i.e., "current ripple"). The input AC from the mains supply 16 is sinusoidal as understood. The output of AC/DC converter 24a is a DC voltage and a current ripple. The PB converter 26 post-processes the DC voltage and current ripple output of the AC/DC converter 24a to preferably eliminate or substantially eliminate (or minimize or at least reduce) the current ripple and transform the output of the AC/DC converter 24a into a battery level DC output. It is recognized that the AC/DC converters 24b, 24c operate similarly than the AC/DC converter 24a as noted directly above to minimize the current ripple and transform the output of the AC/DC converter 24b, 24c to into the battery level DC output. The OBC 120 includes a first switch 130a and a second switch 130b. The first switch 130a is operably coupled to an input of the AC/DC converter 24b. The controller 120 selectively controls which of the mains supplies 24a, 24b provides AC energy to the AC/DC converter 24b. The controller 120 selectively controls which of the mains supplies 24b, 24c provides AC energy to the AC/DC converter 24c. The first and second switches 130a, 130b enable a supply voltage from a three-phase AC voltage source (e.g., both switches 130a, 130b are off) or from a single-phase AC source (both switches 130a, 130b are on) and/or from a single phase AC (e.g., both switches 130a, 130b are on and three In general, the power value for the OBC 120 may be defined by sourcing capabilities of domestic sockets (e.g., 3.3 kW for 240Vac/16A sockets, 7.2K for 240 Vac/32A sockets, 11 kW for 240 Vac/48A and 22 kW for 240 Vac/96A three phase sockets). To decrease dissipation losses or weight directly related with current, Original Equipment Manufacturers (OEMs) may upgrade vehicle designs to, for example, an 800V high voltage network. At direct DC charging (from an external DC power supply) with same current (same wiring), doubling the voltage capability while reducing the charging time. In the 800V scenario, the PB converter 126 operates at 800V and may include components that may withstand, for example, 1200V. Under such conditions, the PB converter 126 may handle currents of 30 $A_{rms}$ due to higher voltage compared with 400V OBCs.

In reference to the system 100, two voltage domains are illustrated (e.g., AC voltage domain 140 and 800V DC voltage domain 142), the AC voltage domain 140 is generally galvanically isolated from the high voltage battery domain 142 (or the secondary of the OBC 120). The electronic components that comprise the AC/DC converters 24a, 24b, 24c and the PB converter 126 and various energized components (e.g., busbars, printed circuit boards (PCBs), interconnections) must respect clearance and creepage distances to protect from electrical safety with respect to an OBC chassis ground (e.g., vehicle ground).

Figure 8:
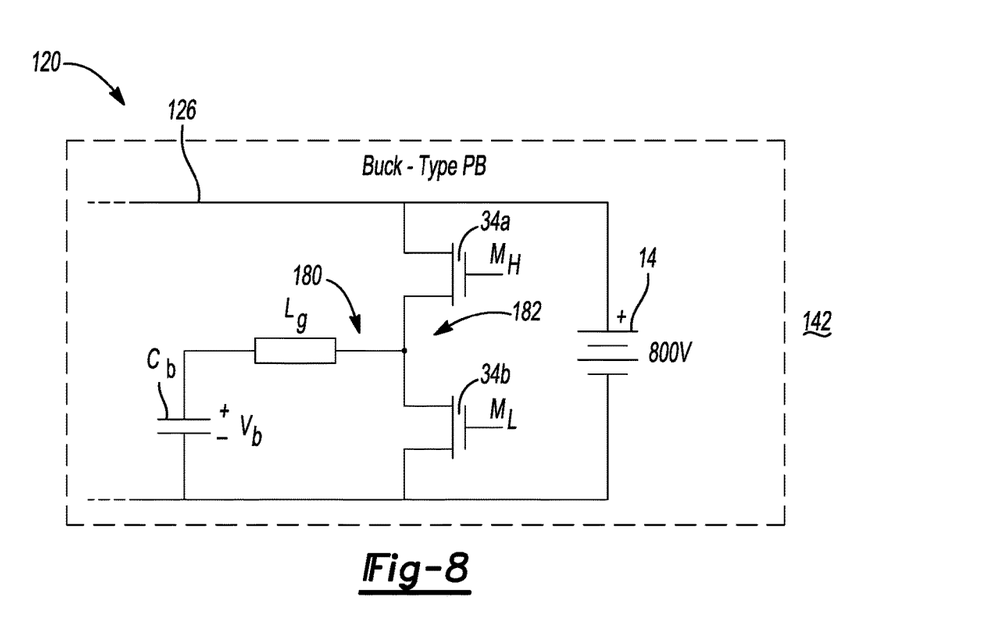
FIG. 8 depicts a more detailed example of a pulsating buffer (PB) converter shown in FIG. 7 in accordance to one embodiment.

FIG. 8 generally depicts a more detailed implementation of the PB converter 126 in accordance to one embodiment. In one example, the PB converter 126 may be implemented as a buck-type PB converter 126. In this case, the PB converter 126 may step down the DC voltage provided by one or more of the AC/DC converters 24a, 24b, 24c to the traction battery 14. The PB converter 126 as illustrated in FIG. 8 is generally similar to the PB converter 26 as set forth in FIG. 6.

The PB converter 126 includes a plurality of power switches 34a and 34b, an inductor Lr, and an energy storage capacitor $C_b$. The PB converter 26 thus has a current ripple processing based on pulsating buffer topology. The PB converter 26 receives the current ripple outputted from the AC/DC converter 24. The controller 20 controls the power switches 34a, 34b to eliminate the current ripple and transform the output of AC/DC converter 24 into a battery level DC output for charging traction battery 14. The buck type PB converter 126 generally includes the capacitor $C_b$ being in series with the inductor Lr thereby forming a first branch 180 (or node). The branch 180 is in parallel with the power switch 34b to form a second branch 182 (or node). The first switch 34a is in series the first branch 180 and the second branch 182. The layout or arrangement of the PB converter 226 as noted directly above yields an overall reduction of current at 400 Volts from approximately 61A to approximately 31A (see Table 1 below and columns 1 and 3)

The capacitor $C_b$ is connected in parallel between the secondary-side power switch bridge 32 (see FIG. 6 for element 32) and the PB converter 26. The capacitor $C_b$ is charged with a secondary-side input voltage/current ($v_{os}$)/($i_{os}$) to supply therefrom a secondary-side output voltage/current.

The PB converter 126 draws a buffer current associated with a buffer voltage from capacitor $C_b$. controls the operation of pair of the power switches 34a, 34b of the PB converter 126 for the PB converter 126 to draw a requisite amount of buffer current associated with the buffer voltage and generate therefrom a targeted, battery voltage/current. The targeted, battery voltage/current is output from the PB converter 126 to charge the traction battery 14. In general, the PB converter 126 is arranged to operate in the 800V domain 142 (e.g., 450-850 V) while at the same time utilize a reduced amount of current. For example, the OBC 120 may operate in the 800V domain.

Figure 9:
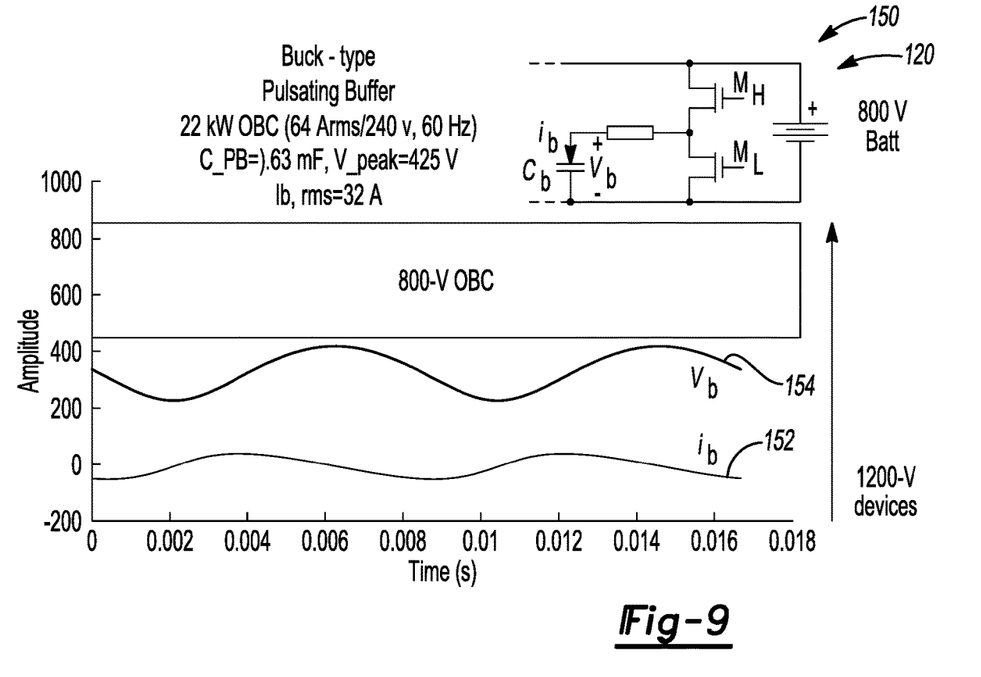
FIG. 9 depicts a plot of a processed current and voltage at the PB converter in accordance to one embodiment.

FIG. 9 depicts a plot 150 of processed currents and a voltage at the PB converter 126 in accordance to one embodiment. Waveform 152 illustrates current processed by the PB converter 126 over time (e.g., current $i_b$ that flows through the capacitor $C_b$). Waveform 154 illustrates voltage processed by the PB converter 126 over time (e.g., voltage $v_b$ across the capacitor $C_b$). As noted above, the PB converter 126 operates in the 450-850 V range. In general, the voltage in the capacitor Cb may be lower than the battery voltage due to the buck operation of the PB converter 126. In one operational mode, the voltage of the capacitor Cb voltage may be variable and may be set to be slightly lower than the battery voltage to reduce the current in the PB converter 126 and, consequently, increase the efficiency.

Figure 10:
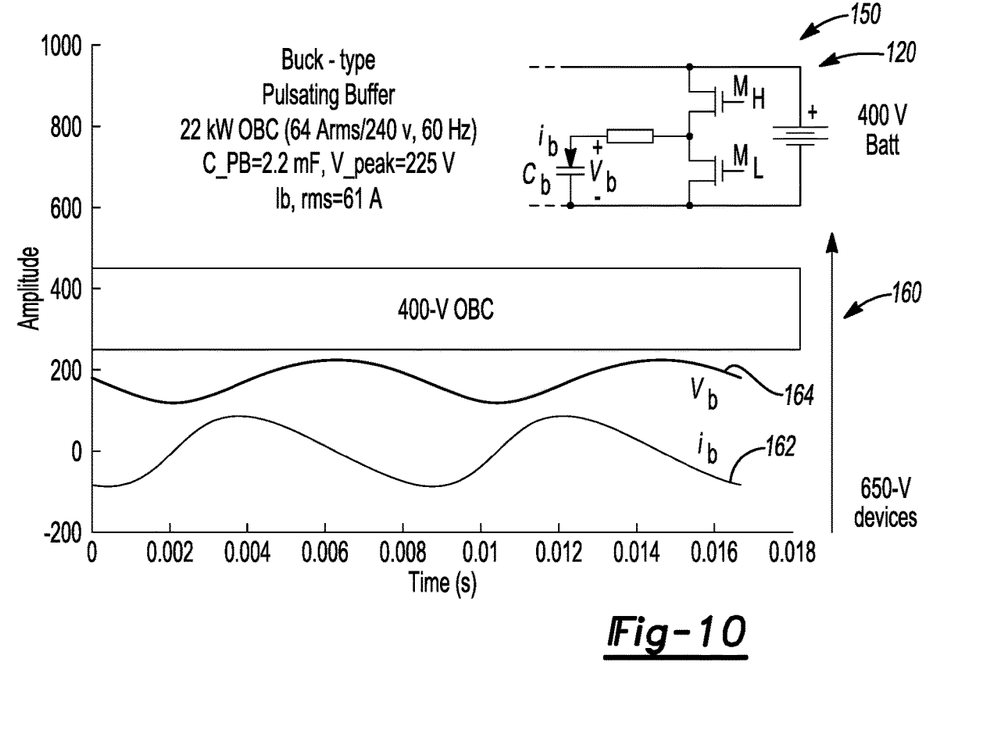
FIG. 10 depicts another plot of processed current and voltage at the PB converter in accordance to one embodiment.

FIG. 10 depicts another plot 160 of a processed current and voltage at the PB converter 126 (see FIG. 3). Waveform 162 illustrates current processed by the PB converter 126 over time (e.g., current $i_b$ across the capacitor $C_b$). Waveform 164 illustrates voltage processed by the PB converter 126 over time (e.g., voltage vb across the capacitor $C_b$). The PB converter 126 in this case may operate at 400V instead of the 800V variation as noted above. For the 400V based PB converter 126, current $i_b$ across the capacitor $C_b$ may be doubled when compared to the current for the PB converter 126 utilized in connection with the 800V variant. Thus, when power is increased to 22 kW, the PB converter 126 may have to withstand a current of up to 60 $A_{rms}$. The processing of such a high current may directly impact the number of switches 34a, 34b and the overall size of the inductor Lr, on the PB converter 126 for the 400V variation thereof. As illustrated in FIG. 10, the typical battery voltage may be in a range of 250-450 V thereby forcing the peak voltage across the capacitor $C_b$, to a voltage of 225V in the worst case (for a 250V battery level).

Figure 11:
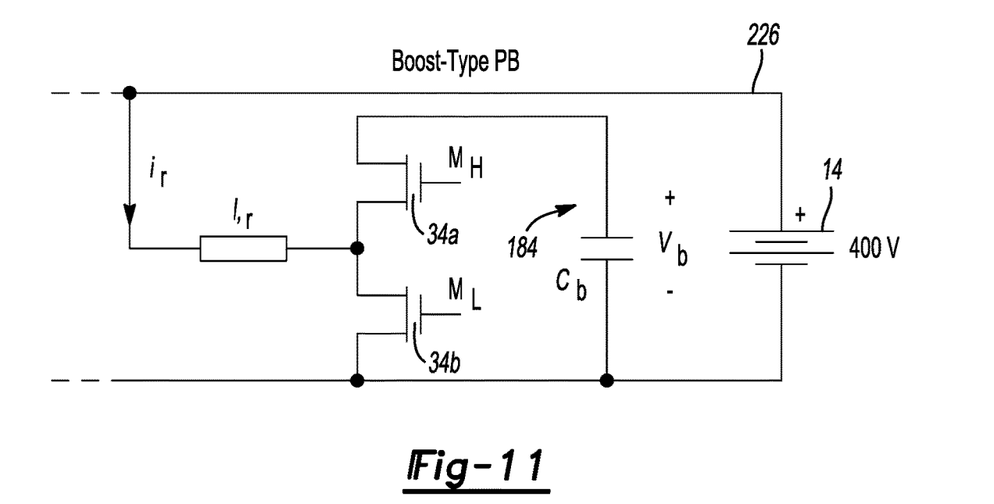
FIG. 11 depicts another PB converter in accordance to one embodiment.

FIG. 11 generally depicts a more detailed implementation of a PB converter 226 in accordance to one embodiment. In one example, the PB converter 226 may be implemented as a boost-type PB converter 226. The PB converter 126 includes the plurality of power switches 34a and 34b, the inductor Lr, and the energy storage capacitor $C_b$. The boost type PB converter 226 generally includes the inductor Lr being in series with the power switch 34a and the power switch 34b. The switch 34a and the capacitor Cb are in series with one another and form a first branch 184 (or first node). The branch 184 is in parallel with the power switch 34b. The layout or arrangement of the PB converter 226 as noted directly above yields an overall reduction of current at 400 Volts to approximately 15A (see Table 1 below and column 2).

The voltage at the capacitor $C_b$, may operate at a higher voltage and then with the same energy flow, at a lower current (see directly above). Such a lower current minimizes losses thereby increasing efficiency. For example, the energy stored in the inductance Lr is used to boost the voltage from the battery 14 to a higher voltage in the capacitor $C_b$. Consequently, due to the boost operation of the PB converter 226, the voltage of the capacitor $C_b$, may be higher than the voltage of the battery 14. This high voltage operation may ensure a low current through the PB converter 226 and, consequently, highly efficient operation. The PB converter 226 may reduce current levels for a 400V OBC variant. In general, the PB converter 226 in the boost mode entails a high voltage at the capacitor $C_b$, and for power devices. In general, the PB converter 226 may be more suited for 400-V batteries rather than 800-V batteries.

Figure 12:
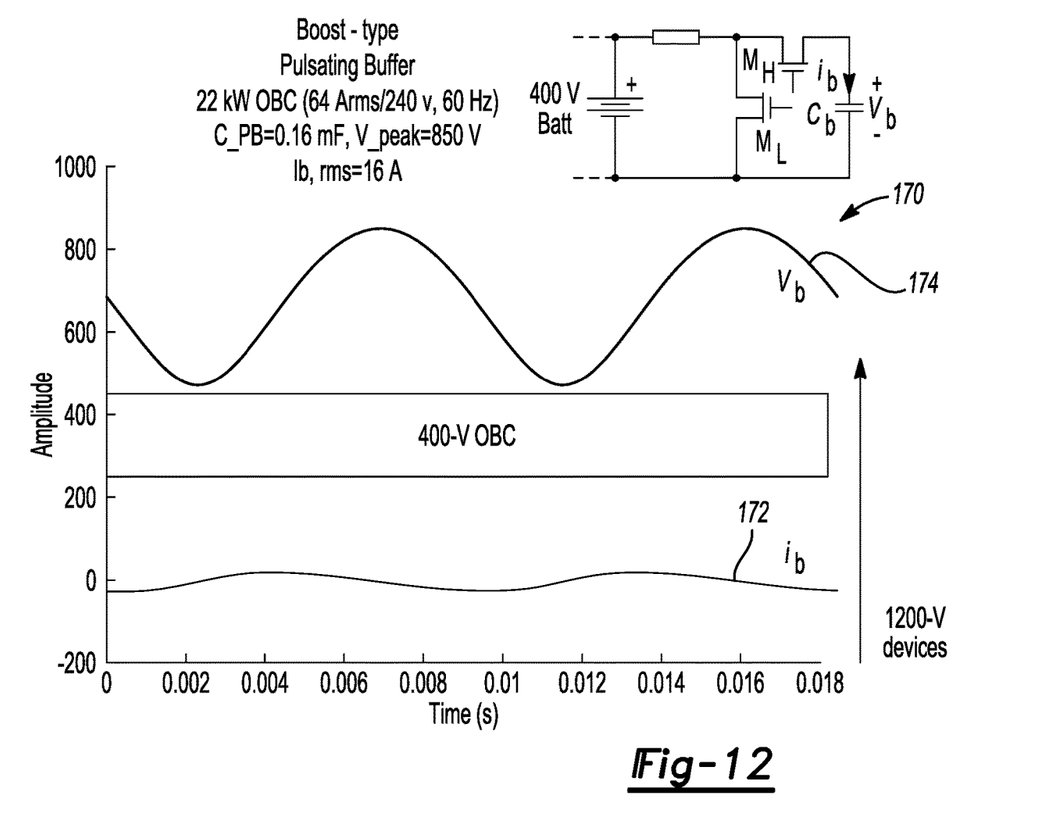
FIG. 12 depicts a plot of processed current and voltage at the PB converter of FIG. 11 in accordance to one embodiment.

FIG. 12 depicts a plot 170 of processed current and voltage at the PB converter 226 of FIG. 11 in accordance to one embodiment. Waveform 172 illustrates current processed by the PB converter 226 over time (e.g., current $i_b$ across the capacitor $C_b$). Waveform 174 illustrates voltage processed by the PB converter 226 over time (e.g., voltage $v_b$ across the capacitor $C_b$). The PB converter 126 operates at 400V. In general, the voltage, vb across the capacitor $C_b$ of the PB converter 226 may be increased to 850V (see waveform 174) for the capacitor $C_b$. In this case, the maximum voltage across the PB converter 226 may be set by the device technology while the lower across the capacitor $C_b$ may be set to 450V. Consequentially, the current level, $i_b$ for the same output power may be reduced (e.g., up to four times) as depicted in the waveform 172.

With reference to the PB converter 126 as illustrated in connection with FIG. 8 and the PB converter 226 as illustrated in connection with FIG. 11, it is recognized that similar switches 34a and 34b and inductors $L_r$ may be used for both configurations and for 400V and 800V variants. For example, the PB converters 126, 226 may each be used for the following OBC configurations 11 kW/400V, 11 kW/800 W, 22 kW/400V and 22 kW/800V. Specifically, similar hardware architectures may be used between the PB converter 126 and 226 with the exception of components values for the inductor $L_r$ and the capacitor $C_b$.

TABLE I

| | Key PB Components/Ratings | | | |
| --- | --- | --- | --- | --- |
| | 400-V OBC (22 kW) | | 800-V OBC (22 kW) | |
| | Buck-type PB Converter | Boost-type (PB Converter 226) | Buck-type (PB Converter 126) | Boost-type |
| Capacitance (µF), $C_b$ | 2.2 mF (Electrolytic 6 × 360 µF) | 190 µF (Film, 3 × 65 µF) | 210 µF (Film, 3 × 210 µF) | Not valid (limited by 1200-V device technology) |
| Peak PB capacitor voltage (V) | 225 V | 850 V | 425 V | |
| PB capacitor RMS current (A) | 61 A | 15 A | 31 A | |

As shown above, the PB converter 126 and the PB converter 226 utilize a capacitance for the capacitor, $C_b$ of 210 µF and 190 µF, respectively. Thus, the capacitor $C_b$ is generally similar and enable a similar footprint when implemented on the OCB 120 thereby enabling similar devices for use for both the 400V OBC 120 and the 800 OBC 120. Additionally, the 400V OBC 120 and the 800V OBC 120 may be packaged in similar sized housing and therefrom remove complexity between 400V and 800V OBC applications. Further, the PB converter 126 used in connection with the 400-V OBC (22 kW) as illustrated above Table 1 shows a reduction in current across the capacitor $C_b$ (e.g., 15A) in comparison to the current that flows across the capacitor $C_b$ for the PB converter 126 (e.g., 61A) illustrated in the first column for the PB converter 126 for the 400-V OBC.

Figure 13:
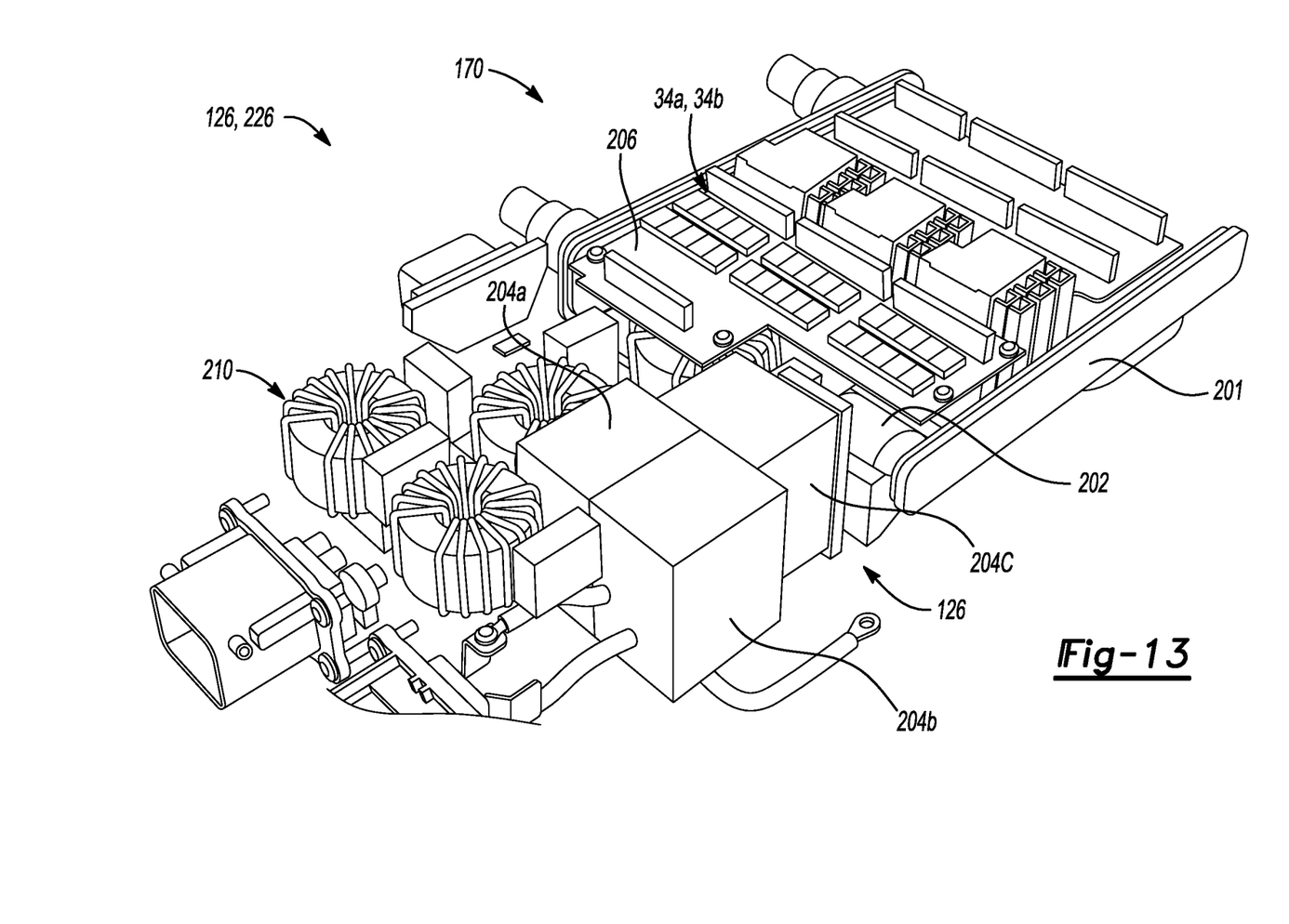
FIG. 13 depicts an example of an OBC including the PB converter in accordance to one embodiment.

FIG. 13 depicts an example of an OBC 120 including the PB converter 126 (or 226) in accordance to one embodiment. As noted above, the PB converter 126 may be a buck type converter or the PB converter 226 may be a buck type converter and each includes a housing 201. The PB converter 126 (or 226) includes inductor $L_r$ (labeled as reference numeral 202) and a capacitor $C_b$ (labeled as a plurality of capacitors 204a-204c) positioned in the housing 201. It is recognized that the number of inductors 202 and capacitors 204a-204c may vary based on the required voltage OBC applications. In general, the PB converter 126, 226 may provide for common dimensions between the Buck type and Boost type converter, respectively, in addition to common dimensions (e.g., length, width, thickness, etc.) for a 400-V OBC and an 800-V OBC. For example, the OBC 120 includes a printed circuit board (PCB) 206 and the plurality of power switches 34a and 34b (or $M_H$ and $M_L$) as illustrated in FIGS. 8-12.

As shown in FIG. 13, the plurality of power switches 34a and 34b are positioned on the PCB 206 whereas the inductor (s) 202 and the capacitors 204a-204c are positioned off of the PCB 206. In this case, the OBC 120 may utilize common PCB dimensions (e.g., length, width, thickness, etc.) between the Boost and Buck type OBC 120 and for the different voltage requirements (400 or 800V) for the OBC 120. The OBC 120 further includes a plurality of windings (or coils) 210 that are also positioned off board of the PCB 206. This may also enable the OBC 120 to utilize the common dimensions for the PCB 206 as noted above.

In one example, the inductor 202 may be coupled to the PCB 206 and to the various power switches 34a and 34b via terminals, copper wires, hardware-based interconnections. For example, electrical traces and vias may be provided within the PCB 206 and may be coupled to the power switches 34a and 34b via the terminals, copper wires, hardware-based interconnections, etc. The capacitors 204a-204c may also be coupled to the PCB 206 and to the various power switches 34a and 34b via terminals, copper wires, hardware-based interconnections. In addition, the electrical traces and vias may be provided within the PCB 206 and may be coupled to the power switches 34a and 34b via the terminals, copper wires, hardware-based interconnections, etc.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus comprising:
   a pulsating buffer (PB) converter to provide an energy output to one or more vehicle batteries, the PB converter including:
   a housing;
   a printed circuit board (PCB) positioned in the housing and including at least one first power switch and at least one second power switch positioned thereon;
   at least one inductor positioned in the housing and off board from the PCB to interface with the at least one first power switch and the at least second power switch; and
   at least one capacitor positioned in the housing and off board from the PCB to interface with the at least one first power switch and the at least one second power switch to regulate the energy output to the one or more vehicle batteries during the charging operation.

2. The apparatus of claim 1, wherein the PB converter is a buck type converter for charging up to 800V on the one or more vehicle batteries.

3. The apparatus of claim 2, wherein the PB converter includes the at least one inductor is in series with the at least one capacitor to form a first branch.

4. The apparatus of claim 3, wherein the first branch is in parallel with the at least one second power switch to form a second branch.

5. The apparatus of claim 4, wherein the at least one first switch is in series with the first branch and the second branch to regulate an 800V output by reducing current through the at least one capacitor.

6. The apparatus of claim 1, wherein the PB converter is a boost type converter for charging up to 400V on the one or more vehicle batteries.

7. The apparatus of claim 6, wherein the PB converter includes the at least one inductor being in series with the at least one first power switch and the at least one second power switch.

8. The apparatus of claim 7, wherein the PB converter includes the at least one first power switch and the at least one capacitor in series with one another to form a first branch.

9. The apparatus of claim 8, wherein the first branch is in parallel with the at least one second power switch to boost a voltage from the one or more vehicle batteries at the at least one capacitor.

10. An apparatus comprising:
    a pulsating buffer (PB) converter including:
    a housing;
    a printed circuit board (PCB) positioned in the housing and including at least one first power switch and at least one second power switch positioned thereon;
    at least one inductor positioned in the housing and off board from the PCB to interface with the at least one first power switch and the at least second power switch; and
    at least one capacitor positioned in the housing and off board from the PCB to interface with the at least one first power switch and the at least one second power switch to regulate an energy output to one or more vehicle batteries during a charging operation.

11. The apparatus of claim 10, wherein the PB converter is a buck type converter for charging up to 800V on the one or more vehicle batteries.

12. The apparatus of claim 11, wherein the PB converter includes the at least one inductor is in series with the at least one capacitor to form a first branch.

13. The apparatus of claim 12, wherein the first branch is in parallel with the at least one second power switch to form a second branch.

14. The apparatus of claim 13, wherein the at least one first switch is in series with the first branch and the second branch to regulate an 800V output by reducing current through the at least one capacitor.

15. The apparatus of claim 10, wherein the PB converter is a boost type converter for charging up to 400V on the one or more vehicle batteries.

16. The apparatus of claim 15, wherein the PB converter includes the at least one inductor being in series with the at least one first power switch and the at least one second power switch.

17. The apparatus of claim 16, wherein the PB converter includes the at least one first power switch and the at least one capacitor in series with one another to form a first branch.

18. The apparatus of claim 17, wherein the first branch is in parallel with the at least one second power switch to boost a voltage from the one or more vehicle batteries at the at least one capacitor.

19. An apparatus comprising:
- a printed circuit board (PCB) positioned in the housing and including at least one first power switch and at least one second power switch positioned thereon;
- at least one inductor positioned in a housing and off board from the PCB to interface with the at least one first power switch and the at least second power switch; and
- at least one capacitor positioned in the housing and off board from the PCB to interface with the at least one inductor, the at least one first power switch, and the at least one second power switch to provide an energy output to store a first voltage or a second voltage on one or more vehicle batteries during a charging operation.

20. The apparatus of claim 19, wherein the first voltage is 400 V and the second voltage is 800V.

* * * * *